United States Patent [19]
Stickel et al.

[11] Patent Number: 5,434,424
[45] Date of Patent: Jul. 18, 1995

[54] SPINNING RETICLE SCANNING PROJECTION LITHOGRAPHY EXPOSURE SYSTEM AND METHOD

[75] Inventors: Werner Stickel; Rodney A. Kendall, both of Fairfield County, Conn.

[73] Assignee: International Business Machines Corporation, Armonk, N.Y.

[21] Appl. No.: 310,176

[22] Filed: Sep. 21, 1994

[51] Int. Cl.⁶ .................... H01J 37/317; G03B 27/46; G21K 1/06
[52] U.S. Cl. ................. 250/492.23; 378/34; 355/50
[58] Field of Search .......... 250/492.23, 492.2; 378/34; 355/50

[56] References Cited
U.S. PATENT DOCUMENTS

| | | | |
|---|---|---|---|
| 4,613,981 | 9/1986 | Siddall et al. | 378/34 |
| 5,263,073 | 11/1993 | Feldman | 378/34 |
| 5,289,231 | 2/1994 | Magome et al. | 355/50 |

FOREIGN PATENT DOCUMENTS 256390  5/1988  German Dem. Rep. ......... 250/492.2

*Primary Examiner*—Jack I. Berman
*Attorney, Agent, or Firm*—Whitham, Curtis, Whitham & McGinn; Charles W. Peterson

[57] ABSTRACT

A reticle disk with an annular pattern area is used in a reduction projection lithography system in place of a reticle with a rectilinear pattern layout. The reticle disk is rotated on a continuous basis during patterning of a substrate, and the patterning-beam emanating from the annular pattern area is scanned over the substrate using an X-Y stage. The imaging beam, which is preferably an electron-beam, may be scanned across the annular pattern area in a radial direction to allow patterning a plurality of subfields.

9 Claims, 1 Drawing Sheet

SPINNING RETICLE SCANNING PROJECTION LITHOGRAPHY EXPOSURE SYSTEM AND METHOD

BACKGROUND OF THE INVENTION

1. Field of the Invention

The invention is generally related to lithography exposure systems and methods for wafer and chip manufacture. More specifically, the invention is directed to a reduction projection imaging system wherein X-Y movements of the reticle used to pattern the fields on the wafer or chip are eliminated.

2. Description of the Prior Art

While current optical lithography is now capable of patterning integrated circuits below 0.5 microns, the wavelength of the exposing light eventually will limit the application of this technology. The wavelength not only limits resolution, but, most importantly, the depth of focus, requiring complex "tricks" to extend it. Thus, X-ray, electron, and/or ion beam lithography techniques are likely to become the method of choice for producing feature sizes approaching 0.1 microns or smaller.

Photo-optical reduction projection systems are the mainstream tools for integrated circuit lithography. They are capable of exposing the entire area of one or more integrated circuit chips at a time. Analogous systems using particle beams have not proven feasible to this date. A combination, however, of reduction projection optics and established technology of probe-forming electron beam lithography systems appears to be a feasible approach. For example, a beam with defined size is scanned across a reticle containing the enlarged replica of the circuit pattern to be delineated on the substrate (wafer), thereby sequentially illuminating portions of the pattern, which then are demagnified by the electron optical elements (lenses) of the system and projected onto the wafer. The Japanese patent application JP 61-283121 to Nippon Telegraph & Telephone company, which is incorporated by reference, describes fundamentals of such a system, referred to as "conventional reduction projection systems" hereafter. In addition to the beam scanning, these systems require the step-wise or continuous placement of reticle and wafer in synchronism "under the beam", i.e., within the scanning range of the beam, since this range is in general insufficiently large to cover the entire chip area. Often, the mechanical motion follows a serpentine path, covering the chip area in parallel stripes of limited width.

U.S. Pat. No. 5,263,073 to Feldman, which is incorporated by reference, describes traditional serpentine and step-and-scan stage motions employed in reduction projection lithography systems. Conventional reduction projection lithography systems place great demands on the mechanical and electrical systems, which provide the stage movements of the reticle and the substrate in order to achieve the throughput necessary for profitable semiconductor chip and wafer manufacturing. The reticle stage system is more severely stressed than the substrate stage system, because the speed of the reticle stage movements must be higher than that of the substrate stage by the optical reduction factor. Thus, scanning a rectilinear array of subfields, which compose a chip pattern, at high speeds (e.g., 400–500 mm/s) with multiple acceleration and deceleration operations places severe demands on the mechanical handling system in terms of system stability, vibration control, synchronism and accuracy of reticle and wafer stage motions, reticle clamping, and overall complexity, and these demands result in increased costs associated with the reticle stage and control system.

Japanese Patent abstract 59-189268 to Hitachi Ltd. describes a system that improves throughput and reduces costs, wherein the drawing region of the reticle is divided into four segments with two parts oriented vertically and two parts oriented horizontally. In operation, the pattern is drawn on the substrate by drawing one of the four segments, then rotating the stage 90 degrees at the end of the segment to draw the next segment, and so on. This system essentially is a step-and-scan approach which would still suffer some of the problems related to mechanical movement control discussed above. In addition, the Hitachi system may be limited for use in exposing small chips on the order of 5 mm since the pattern is only split into four segments.

SUMMARY OF THE INVENTION

It is an object of this invention to provide a reduction projection lithography system which does not require x-y movement for the reticle.

It is another object of this invention to provide a simplified reticle system for imaging a pattern onto a substrate which does not suffer from problems such as vibration, and does not require complex mechanical and electrical positioning and control systems.

It is yet another object of this invention to provide a lithography system with a spinning reticle with an annular pattern area that is imaged onto an underlying substrate.

According to the invention, a reticle disk includes a pattern of subfields positioned within an annular section. The reticle disk remains stationary during imaging and rotates about a center point. An electron beam or ion beam is emitted from an illumination source and passes through the annular pattern area. The lithography beam emerging from the annular pattern area is then projected in a contracted or reduced form onto a wafer or other substrate. During patterning of the wafer or substrate, the reticle disk rotates to present new fields or subfields to be patterned and only the wafer or substrate is moved in the X-Y plane using a wafer stage. Preferably, the reticle disk rotates continuously at a constant speed so that mechanical and electrical positioning and control system demands are minimized and vibration problems are avoided. Multiple rows of subfields may be present within the annular section, and these rows can be imaged onto the wafer or substrate by scanning the electron beam in a radial direction within the width of the annulus using deflectors or other suitable scanning systems (the deflection range being defined as the field of the beam). Only a small azimuthal positional correction will be required to compensate for the rotation of the disk during the scan time.

BRIEF DESCRIPTION OF THE DRAWING

The foregoing and other objects, aspects and advantages will be better understood from the following detailed description of the preferred embodiments of the invention with reference to FIG. 1 which is an isometric view of the components of the spinning reticle scanning projection lithography exposure system.

DETAILED DESCRIPTION OF THE PREFERRED EMBODIMENTS OF THE INVENTION

Figure 1:
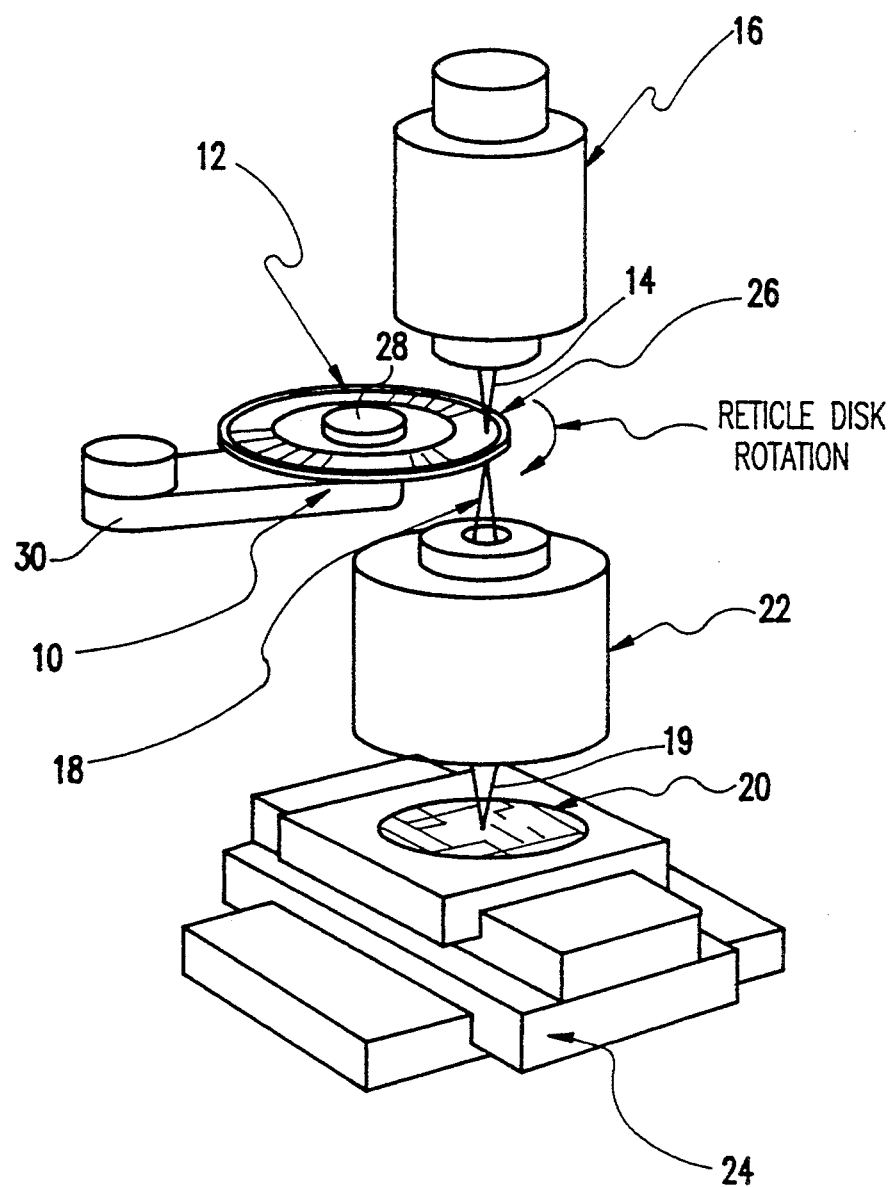

FIG. 1 shows a preferred embodiment of a lithography system according to the present invention. The central feature of the present invention is the use of a reticle disk 10 with an annular pattern area 12 instead of a reticle with a rectilinear array of subfields. The imaging beam 14, which is preferably an electron beam but could also be an X-ray beam or another suitable particle beam (i.e., ion beam), is preferably generated by the illumination section 16 of an electron column. The imaging beam 14 is directed through the pattern of subfields in the annular pattern area 12 and the patterning beam 18 which emerges from the annular pattern area 12 is then collected and projected onto a wafer 20 or other substrate. Preferably, the projection portion 22 of an electron column is used for directing the patterning beam 18 onto the wafer 20 and the projected image 19 is reduced image of the pattern in the annular pattern area 12 of the reticle disk 10.

During patterning of the wafer 20, the reticle disk 10 spins and the wafer 20 is moved using a wafer stage 24 or other suitable apparatus that can move the wafer 20 in the X-Y plane relative to the projected image 19 beam. The wafer stage 24 preferably can move the wafer 20 rectilinearly, in a serpentine pattern, or in any pattern desired. Thus, a pattern is drawn or printed onto the wafer 20 by the projected image 19 as the wafer 20 is moved in the X-Y plane, and the pattern drawn on the wafer is dictated by the the subfields of the pattern postioned in the annular pattern area 12 of the reticle disk. Preferably, the reticle disk 10 spins continously during patterning of the wafer 20, and at a constant, and preferably slow, speed so that vibrations are minimized and demands on the mechanical scanning system are reduced.

If desired, the annular pattern area 12 can have multiple columns with multiple rows containing sequences of subfields in the radial direction. Arrow 26 indicates that the imaging beam 14 can be radially scanned across the width of the annular pattern area 12 to image the various subfields onto the wafer 20. Radial scanning of the imaging beam 14 can be achieved with deflectors (not shown) or other suitable devices. Only a small azimuthal positional correction will be required to compensate for the rotation of the disk during radial scanning. In operation, the rows of subfields in the annular pattern area 12 can be imaged onto the wafer 20 by a variety of techniques. For example, the rows could be imaged sequentially with one column being imaged by a full revolution of the reticle disk 10 followed by radial movement of the imaging beam 14 relative to the annular pattern area 12 to image the next column during the next revolution, or the rows of subfields can be imaged onto the wafer such that radial scanning 26 of the imaging beam 14 and rotation of the reticle disk 10 occur simultaneously.

FIG. 1 shows the reticle disk 10 as being a round device that rotates about a central point 28 under the influence of a drive mechanism 30 connected to the disk 10; however, it should be understood that the reticle disk 10 can assume any of a variety of shapes. The important feature is that the annular pattern area be layed out such that it can be rotated with respect to the imaging beam 14 to project a pattern on the wafer 20. In addition, while FIG. 1 shows the annular pattern area 12 inside the outer periphery of the reticle disk 10, it should be understood that the pattern could extend to the periphery of the disk 10.

In one embodiment, the annular pattern area 12 could include all the subfields required for a single integrated circuit chip. Preferably, the subfields would be layed out in a plurality of rows inside the annulus 12. In operation, the stage 24 would orient the wafer 20 at the site of a first chip. The imaging beam 14 would then be produced with the reticle disk 10 spinning about its central axis 28 and the X-Y stage 24 simultaneously moving rectilinearly, in a serpentine pattern, or the like, to cause the patterning beam 18 emanating from the disk 10 to be projected onto the wafer to draw a pattern. After a sufficient number of revolutions of the disk and radial scanning 26 of the imaging beam 14 across the width of the annular pattern area, to transfer all the subfields of the reticle disk 10 to the wafer 20, the imaging beam would be interrupted and the X-Y stage 24 would move the wafer to the beginning position of the second integrated circuit to be patterned. The process would be repeated until all integrated circuit chips required are patterned onto the wafer 20.

EXAMPLE

The following calculations demonstrate that it should be feasible to fit an entire chip pattern within the annulus of a reticle disk and discuss the scanning operations performed. It should be understood that the size of the reticle and mode of scanning can be varied within the practice of this invention from the ranges and procedures discussed below.

The throughput of an e-beam system as described is competitive (to mainstream optical lithography systems), if it is in the order of 30 200 mm-wafers per hour. The time allocation for one wafer then is $120s$. At least $15s$ are required to exchange wafers on the stage, and, also, $5s$ may be required per wafer to register the exact positions of reticle and wafer for each chip location (for example purposes, there are 44 20×30 mm chips on a 200 mm wafer). That leaves $100s$ for exposure of those 44 chips or $2.273s$/chip.

Assuming a 1 mm square subfield size on the reticle, and a reduction factor of N=4, then the chip is divided into 9600 subfields. The time allocation to a subfield then is $2273/9600=237$ $\mu s$. In a "conventional" step and scan system the beam would be scanned across the reticle, for example, in the x-direction, covering a row of subfields, while the reticle as well as the wafer would be continuously moved (synchronously, with the NX speed differential, where "N" is the optical reduction factor and "X" means "times") in the y-direction, covering a column of subfield rows or a "stripe". Preferably, the stripe would be parallel to the long side of the chip, to minimize the number of time-consuming stage turnarounds, which require deceleration, movement to an adjacent stripe, and acceleration at the end of each strip.

In the time the beam finishes one row, the stages have to advance by one row in the stripe direction. At a reduction factor of 4×, the size of the chip at the reticle would be 120 mm on the larger side. The reticle will preferably be a thin membrane less than a micron thick, since neither a stencil nor a scattering reticle can easily be made of bulk material. The subfields will need to be separated from each other by supporting struts to allow for the accuracy and stability required in advanced lithography. The beam would be turned off or "blanked", while it traverses the struts on the reticle, and the deflection system would be set up to stitch the subfield images of the wafer back together. At the above subfield size and the width of the support struts between each subfield of approximately 0.3 mm, the distance for advancing by one row in the stripe direction is 1.3 mm.

One of the most advanced e-beam lithography stage systems available at the present time has a speed capability of approximately 250 mm/s. If this system or an equivalent system were employed, the beam would have to spend not much less than approximately 5 ms to scan one row of subfields. With the above time per subfield, this means that the beam has to scan rows containing at least 20 subfields, and therefore should be 26 mm wide. Consequently, a chip with the dimensions given above would require M=4 parallel stripes, each N(=4)×30×1.3 =156 mm long on the reticle. So the inner circumference of the pattern annulus, as described in the present patent application, would have to be [M(=4)+1]×156=780 mm long. Here, the one extra stripe length would be for (4) "dummy" strip fractions of ¼ stripe length between each patterned stripe to cover the time required for the wafer stage to turn around at each stripe end, while the reticle continues to spin. This implies that the turnaround time is not longer than the time spent on ¼ of a stripe, which is reasonable at today's stage technology.

Given the above assumptions the inner diameter of the reticle pattern annulus therefor is $780/\pi=248$ mm, the outer $249+26=275$ mm. It should be understood that different size disks could be used in the practice of this invention, particularly for accommodating different and/or next generation wafers. Since the wafer stage would move in serpentines, every other stripe is written in reverse order. Therefore, the stripes on the reticle have to be patterned alternatingly in reverse. The reticle rotation speed would be $1/[780/1.3 \times 20 \times 237$ $\mu s]=0.35$ Hz $=21$ rpm. This is less than speed required for playing music on an LP record and is slow enough to disregard the centrifugal force that could possibly cause noticable stress deformation of the reticle. Furthermore, with this invention, the reticle positioning system is virtually eliminated as a source of vibrational instabilities. In conventional reduction projection lithography systems, vibration is the paramount concern.

The dummy stripe and its dwell time could also advantageously be used for wafer/reticle alignment purposes.

During the beam scan of a subfield row, the continued rotation of the reticle disk would make the subfields appear to the beam as rotated by 6.2 mrad which is given by the ratio of time per row and time per revolution $(2\times3.14)\times(20\times100 \mu s)/(7\times160$ ms). Several solutions to this problem are possible. First, the reticle maker could employ a stage with the capability to rotate the substrate during exposure. Second, the pattern could be corrected for rotation. Third, the wafer exposure system could be equipped with an electron-optical dynamic rotation compensation lens.

While the invention has been described in terms of its preferred embodiments, those skilled in the art will recognize that the invention can be practiced with modification within the spirit and scope of the appended claims.

We claim:

1. A lithography apparatus, comprising:
    means for directing an imaging beam onto a pattern of subfields;
    means for rotating said pattern of subfields;
    means for projecting a patterning beam emanating from a said pattern of subfields onto a substrate while said pattern of subfields is rotating.

2. The lithography apparatus of claim 1 wherein said means for rotating comprises
    a reticle wherein said pattern of subfields is positioned in an annular pattern area in said reticle; and
    a drive means for driving the rotation of said reticle about a central point in said reticle located inside a region encircled by said annular pattern area.

3. The lithography apparatus of claim 2 wherein said drive means drives the rotation of said reticle at a constant speed during patterning of said substrate.

4. The lithography apparatus of claim 2 further comprising a means for scanning said imaging beam from said means for directing in a radial direction across said annular pattern area.

5. The lithography apparatus of claim 1 further comprising a means for moving said substrate within an X-Y plane while said pattern of subfields is being rotated by said means for rotating.

6. The lithography apparatus of claim 1 wherein said imaging beam directed by said means for directing is an electron beam.

7. The lithography apparatus of claim 1 wherein said patterning beam which is projected by said means for projecting is a reduced image of said pattern of subfields.

8. A method for patterning a substrate, comprising the steps of:
    directing an imaging beam onto a pattern of subfields;
    rotating said pattern of subfields; and
    projecting a patterning beam emanating from said pattern of subfields onto a substrate while said pattern of fields or subfields is rotating.

9. The method of claim 8 further comprising the step of moving said substrate within an X-Y plane while said pattern of subfields is being rotated by said means for rotating.

* * * * *